(12) United States Patent
Brown et al.

(10) Patent No.: US 8,559,180 B2
(45) Date of Patent: Oct. 15, 2013

(54) REMOVABLE IC PACKAGE STIFFENING BRACE AND METHOD

(75) Inventors: Paul J. Brown, Wakefield (CA); Alex L. Chan, Ottawa (CA)

(73) Assignee: Alcatel Lucent, Paris (FR)

( * ) Notice: Subject to any disclaimer, the term of this patent is extended or adjusted under 35 U.S.C. 154(b) by 296 days.

(21) Appl. No.: 12/729,922

(22) Filed: Mar. 23, 2010

(65) Prior Publication Data

US 2011/0235283 A1    Sep. 29, 2011

(51) Int. Cl.
H05K 7/00 (2006.01)
H05K 7/02 (2006.01)
H05K 7/04 (2006.01)

(52) U.S. Cl.
USPC ................................ 361/747; 361/807

(58) Field of Classification Search
None
See application file for complete search history.

(56) References Cited

U.S. PATENT DOCUMENTS

| | | | | |
|---|---|---|---|---|
| 4,679,118 A * | 7/1987 | Johnson et al. | ............... | 361/718 |
| 5,268,821 A * | 12/1993 | Wong | ............... | 361/796 |
| 5,282,111 A * | 1/1994 | Hopfer | ............... | 361/704 |
| 5,301,416 A * | 4/1994 | Foerstel | ............... | 29/593 |
| 5,568,868 A * | 10/1996 | Keller et al. | ............... | 206/724 |
| 5,998,858 A * | 12/1999 | Little et al. | ............... | 257/678 |
| 6,295,203 B1 * | 9/2001 | Lo | ............... | 361/704 |
| 6,433,280 B2 * | 8/2002 | Winterer et al. | ............... | 174/66 |
| 6,471,533 B2 * | 10/2002 | Lai et al. | ............... | 439/331 |
| 6,625,041 B1 * | 9/2003 | Chen | ............... | 361/829 |
| 6,650,003 B1 * | 11/2003 | Benedetto | ............... | 257/659 |
| 6,788,538 B1 * | 9/2004 | Gibbs et al. | ............... | 361/704 |
| 7,335,030 B2 * | 2/2008 | Kunioka et al. | ............... | 439/73 |
| 7,382,626 B2 * | 6/2008 | Dingfelder et al. | ............... | 361/754 |
| 7,489,514 B2 * | 2/2009 | Hamasaki et al. | ............... | 361/721 |
| 7,777,329 B2 * | 8/2010 | Colbert et al. | ............... | 257/719 |
| 8,111,525 B2 * | 2/2012 | Ong et al. | ............... | 361/801 |
| 8,130,489 B2 * | 3/2012 | Chan et al. | ............... | 361/679.32 |
| 2002/0118513 A1 * | 8/2002 | Koseki et al. | ............... | 361/709 |
| 2007/0202732 A1 * | 8/2007 | Yahiro et al. | ............... | 439/326 |
| 2010/0124031 A1 * | 5/2010 | Lin | ............... | 361/747 |
| 2010/0149760 A1 * | 6/2010 | Lu | ............... | 361/747 |
| 2010/0157563 A1 * | 6/2010 | Llapitan et al. | ............... | 361/807 |

* cited by examiner

*Primary Examiner* — Hoa C Nguyen
*Assistant Examiner* — Xanthia C Cunningham
(74) *Attorney, Agent, or Firm* — Kramer + Amado, P.C.

(57) ABSTRACT

Various exemplary embodiments relate to a brace for use with an integrated circuit (IC), and to an IC package with a brace, having a main body portion and a fastening portion for mechanically fastening the main body portion to the IC, by for example clipping or sliding attachment. Other exemplary embodiments relate to a method of stabilizing an IC during an operation carried out on the IC, such as a soldering operation, involving for example steps of attaching a brace to the IC, performing the operation on the IC, and/or removing the brace after performing the operation.

18 Claims, 3 Drawing Sheets

REMOVABLE IC PACKAGE STIFFENING BRACE AND METHOD

TECHNICAL FIELD

Various exemplary embodiments disclosed herein relate generally to the field of integrated circuits (IC), and IC packages and their manufacture, and to the field of area array packaging.

BACKGROUND

A wide variety of semiconductor chips having integrated circuits (IC) are known in the industry. Some examples of IC's include Application Specific Integrated circuits (ASIC) and, Application Specific Standard Product (ASSP). In general, ICs and their packages have been becoming more complex over time, with the result that their power, speed and/or their size has been increasing. Also, ICs are generally attached by having a number of leads that are each individually soldered onto a mounting location of a circuit board or other base component. In some instances, all of these soldered connections may end up not being properly made. This can be particularly true if the IC is not properly flat, since it is generally being mounted to a flat mounting surface.

Warping refers to a bending or twist or general lack of flatness in overall IC package, including particularly the plane formed by the solder joint locations. A lack of flatness in an IC package can cause various problems such as poor soldered joints between the IC package and the mounting surface, poor or no contact at the solder joint, undesirably pillowed joints, or intermittent contact at the solder joints. Lack of flatness can occur where the entire package warps so that it is curved or bent or otherwise non-flat. The desired flatness can in some cases be to a very high tolerance. For example, in some application such as in the context of some BGA packages, a maximum warping tolerance of approx 0.008 inches is desired.

The problem of IC package warping often occurs during the soldering process, also known as reflow, and any re-work of the same. The problem can be exacerbated in larger packages due to the larger size, and is also exacerbated when soldering temperatures become higher. Recently, the use of lead-free solders has become more prevalent on certain product types. This lead-free solder generally requires a higher soldering temperature than prior solders thus potentially exacerbating IC package warpage.

One prior solution to the problem of IC package warping has been the incorporation on top of the IC of a flat stiffener plate that is permanently affixed to the top surface of the IC. The stiffener plate takes the form essentially of a completely flat entirely planar item having a constant thickness, and is a simple rectangle having approximately its perimeter be the size of the IC package perimeter when viewed from the top. A central region of the flat stiffener plate may be cut out. However, these stiffener flat plates suffer from the disadvantage that they themselves are entirely flat, and thus, have a somewhat limited resistance to warping due to temperature change or torsion or bending forces. In order to make a flat plate strong enough to provide desirable resistance to warping in the overall IC package, it can be necessary to make the stiffening plate undesirably thick. It is undesirable for the stiffening plate, which rests on top of the IC, to be too thick because the thick stiffening plate, on top of and added to the IC thickness, causes the entire assembled IC package to be thick, which can be undesirable if the total IC package becomes too thick. thus potentially limiting IC packaging placement options and/or increasing printed circuit card to printed circuit card separation in the final system assembly. Moreover, the added stiffener thickness increases the IC die to lid spacing, thereby creating a larger separation that needs to be filled with Thermal Interface Material, ultimately impeding thermal dissipation from the IC. Moreover, because of the stiffener's entirely flat cross-sectional profile, increased stiffness is achieved inefficiently though the increase of the overall volume of material, thus adding additional cost and weight to the final IC package. Therefore, there is a need in the art for stiffening of IC packages that can provide improved performance and/or mounting reliability while providing a desirable low degree of thickness and/or a desirable low amount of material in the eventual fully installed IC package.

SUMMARY

In light of the present need for stiffening of IC packages that can provide improved performance while providing a desirable low degree of thickness and/or a desirable low amount of material, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a brace for use with an integrated circuit (IC), and to an IC package with a brace, having a main body portion; and a fastening portion for mechanically fastening the main body portion to the IC, by for example clipping or sliding attachment.

Other exemplary embodiments relate to a method of stabilizing an IC during an operation carried out on the IC, such as a soldering operation, involving for example steps of attaching a brace to the IC, performing the operation on the IC, and/or removing the brace after performing the operation.

It should be apparent that, in this manner, various exemplary embodiments enable improved performance and/or mounting reliability. In particular, in some embodiments by providing a removable or permanent stiffener brace that can be attached to and/or removed from the IC.

DETAILED DESCRIPTION

Figure 1:
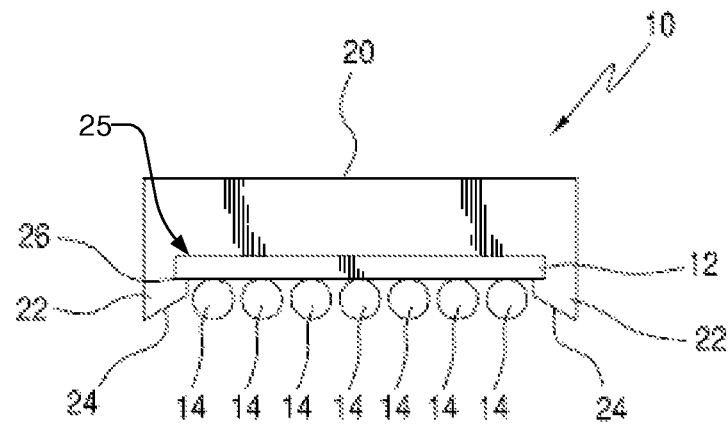
FIG. 1 is a side cross sectional diagram of a stiffening brace clipped on to an IC.

Referring now to the drawings, in which like numerals refer to like components or steps, there are disclosed broad aspects of various exemplary embodiments.

Many embodiments relate to a removable or permanent stiffener brace that can be attached to an integrated circuit (IC) to form an IC package, using a mechanical attachment, such as for example being clipped onto or slid onto the IC. As used throughout this document, the terms IC (integrated circuit) and IC packaging are used interchangeably to make reference to the overall component assembly, which is also commonly referred to as the IC package. Examples of IC packages include for example TSOPS, QFPs, SOIC, BGA, CCGA, etc. It is noted that above approximately 400 connections, IC packaging almost exclusively take on the form of Area Array style packaging, which itself can include various subtypes, such as for example Column Grid Arrays (CCGA), Pin Grid Arrays (PGA), and Ball Grid Arrays (BGA). The brace solutions that are described herein are applicable to such Area Array devices, including for example BGAs. The term IC assembly is used herein to refer to an IC or IC package that may or may not have a brace incorporated therein or mounted thereto.

FIG. 1 is a side cross sectional diagram showing an assembly 10 including an IC 12 having a plurality of solder joints 14. The solder joints 14 are locations for soldering the lead attachments to a mounting location such as for example, a circuit board.

The assembly 10 in the configuration shown in FIG. 1 includes a brace 20. In the example of FIG. 1, the brace 20 has been snapped onto and over the IC 12 by virtue of lower tabs 22 provided on two opposed sides of the brace 20. The tabs 22 each include a slanted ramp surface 24 and a receiving corner 26. The receiving corner 26 wraps around a lower side corner of the IC 12 and thus the stiffening brace 20 is mechanically held on top of the IC 12. One method of installation of the brace 20 onto the IC 12 is simply to push it down above the IC 12. The top side corners of the IC 12 will ride along the ramp surface 24 and the tabs 22 are caused to spread outwardly until the tabs 22 click over the bottom side corners of the IC 12. This installation can involve the tabs 22 of the stiffener 20 being of a resilient material, so they can flex out during this process. Alternatively, the embodiment of FIG. 1 can be slid onto the IC 12 longitudinally from one end of the IC 12, similar to the embodiment described below with reference to FIG. 6, and that variation does not need to employ a resilient material for the tabs 22.

As discussed in more detail below with respect to FIG. 8, many of the braces described herein, including for example the brace of FIG. 1, are used in their clipped or fastened position during aspects of manufacturing and/or installation of the IC package. For example, one use of a brace 20 according to many embodiments herein, would be to clip or fasten the brace 20 onto the IC 12 during the soldering process of soldering the IC 12 onto mounting locations. Since the soldering process often imparts heat, and in some cases imparts a large amount of heat, to the IC, the brace 20 helps resist or even prevent warping or bending of the IC 12 during the soldering process. This is advantageous in that the solder connections 14 are more likely to be effectively made.

Many of the embodiments of braces described herein, including the embodiment of FIG. 1, can be either pre-installed at some point during manufacture of the IC package and even long before the soldering step, or can be installed onto the IC just before soldering, at the time and location of soldering. Further, many of the embodiments described here can be reused after removal from an IC. Alternatively, many of the embodiments described here may be disposed after a single use.

In the instance where the stiffening brace 20 is removed after the soldering process, the vertical height of the stiffener 20 becomes less of a concern in respect to the ultimate height of the resulting mounted IC package. That is, the stiffening brace 20 provides stiffening when it is most needed, i.e., during soldering, but because it is removed, it does not add to the height of the finished installed product. Further, in cases where the brace 20 is removable, it also does not remain associated with the IC 12 during operation of the IC 12, thus, does not interfere with heat dissipation of the IC 12 during its normal installed operation.

Figure 2:
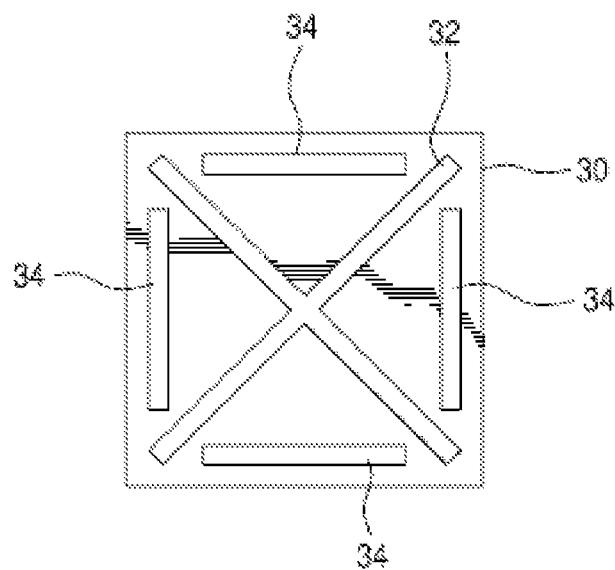
FIG. 2 is a top view of a stiffening brace having reinforcement beams on its top surface.

FIG. 2 is a top view of another embodiment of a stiffener brace 30. This embodiment can be similar to many other embodiments described herein including, for example, the embodiment of FIG. 1, but differs in that it includes additional beam type elements in the form of a cross beam 32 and side beams 34. These beams project upwardly from the top surface of the stiffener 30. The beams 32 and 34 can be integral with the remainder of the brace 30 or can be separate components that are attached by, for example, adhesive. The beams 32 and 34 can have a simple square or rectangular profile viewed from the end, or can have any other suitable profile. The use of beams 32 and 34 can provide further stiffness to the stiffening brace 30, thus, permitting its overall height, volume and mass to be reduced.

Stiffening braces 20 according to many embodiments can be manufactured from a wide variety of suitable materials including for example, metals, ceramics or plastics, including high temperature plastics.

Figure 3:
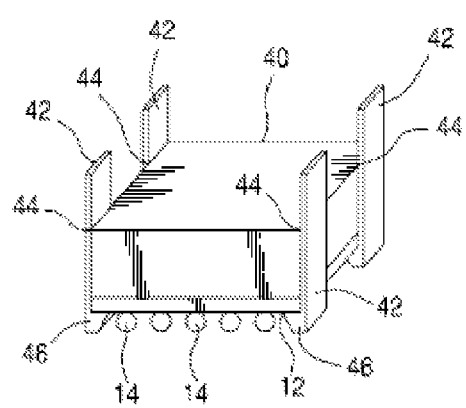
FIG. 3 is a perspective view of a stiffening brace having pivoting clip arms clipped on an IC package.
Figure 4:
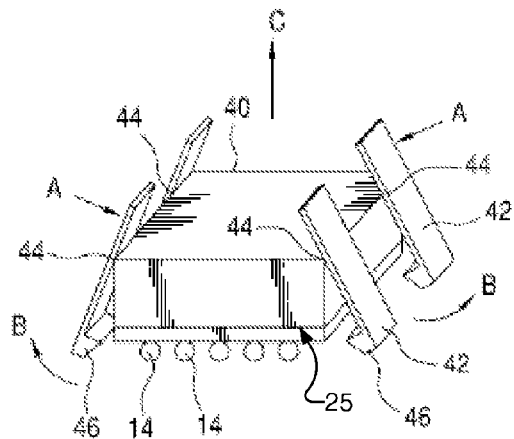
FIG. 4 is a perspective view similar to a FIG. 3 showing the pivoting clip arms pivoted away from the IC package for removal of the brace from the IC package.

FIGS. 3 and 4 are perspective views of another embodiment of a stiffening brace 40 being used in conjunction with an IC 12 having solder joints 14. In this embodiment, the brace 40 includes a plurality of pivoting clip arms 42. In this example, there are four clip arms, two each deposed on opposed sides of the brace 40. The clip arms are hingedly fastened to the main portion of the brace 40 at hinge locations 44 and can pivot around the hinge locations 44. In the view of FIG. 3, the pivot arms 42 are in their natural resting position and are retaining the IC 12 by provision of lower tabs 46, which can operate similar to the tabs 24 of the embodiment of FIG. 1. In the illustration of FIG. 4, pressure has been applied to an upwardly extending part of arms 42 in the direction of the arrows showing as A, and thus the lower end tabs 46 of the clip arms 42 are pivoting outward in the direction shown in as B. This movement releases the lower tabs 46 from engagement with bottom of the IC 12, and permits upward removal of the stiffening brace 40 in the direction shown by the arrow C.

Installation of this embodiment can be performed either or both of two ways. One way for installation would be to perform the opposite steps of the removal, that is applying pressure in the direction A, lowering the stiffener on top of the IC 12, and releasing the pressure A in order to permit the pivot arm 42 to flex down into the position shown in FIG. 3, thus clipping the brace 40 onto the IC 12. Alternatively, if the tabs 46 are shaped with angled ramp surfaces similar to the ramp surfaces 24 in FIG. 1, then the stiffening brace 40 can be clipped onto the IC 12 merely by pushing downwardly on it, which will flex pivot arms 42 outwardly until the brace 40 is clipped onto the IC 12. However, in the embodiments of FIGS. 3 and 4, the angled ramp services are not necessarily needed.

Figure 5:
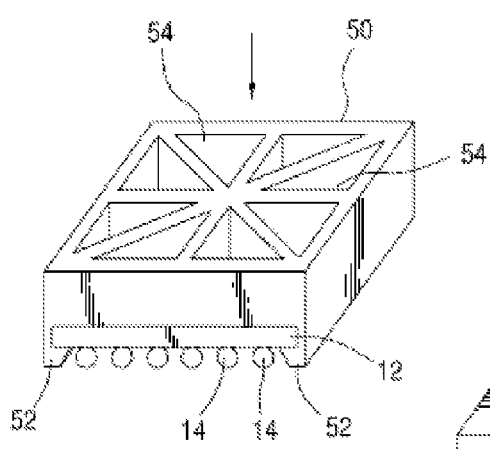
FIG. 5 is a perspective view of a stiffening brace clipped onto an IC package having relief areas cut out through the stiffening brace.

FIG. 5 shows an embodiment 50 of a stiffening brace clipped on to an IC 12 having solder joints 14. This brace 50 can be similar to that of FIG. 1, and have tabs 52 similar to tabs 22 shown in FIG. 1. The brace 50 features relief areas 54 that have been cut out or removed in order to reduce the total size or mass of stiffener 50.

Figure 6:
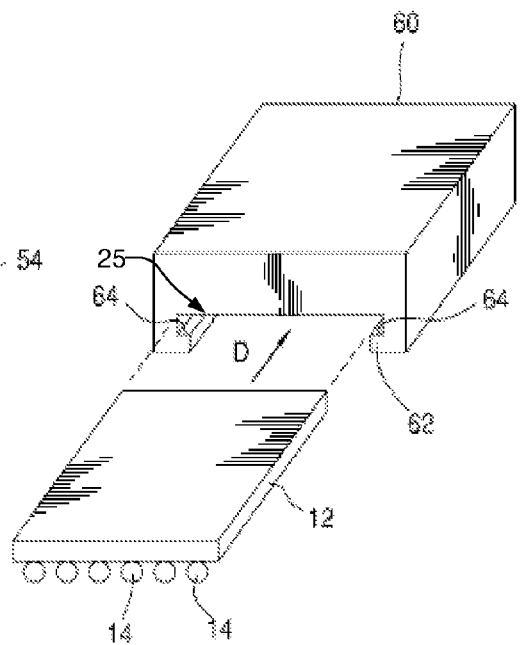
FIG. 6 is a perspective view of a stiffening brace that is slideably installable onto and removable from an IC package.

FIG. 6 shows a stiffening brace 60 having squared off finger tabs 62, as compared to the tabs 22 having the angled ramp surfaces 24 in FIG. 1. This brace 60 however, can be attached onto the IC 12 by being slid onto it from an end of IC 12. Subsequently, the brace 60 can be removed by being slid in the direction shown in arrow D off of the IC 12 if and when desired. The tabs 62 have squared off internal corners to trap the IC when mounted thereto.

Figure 7:
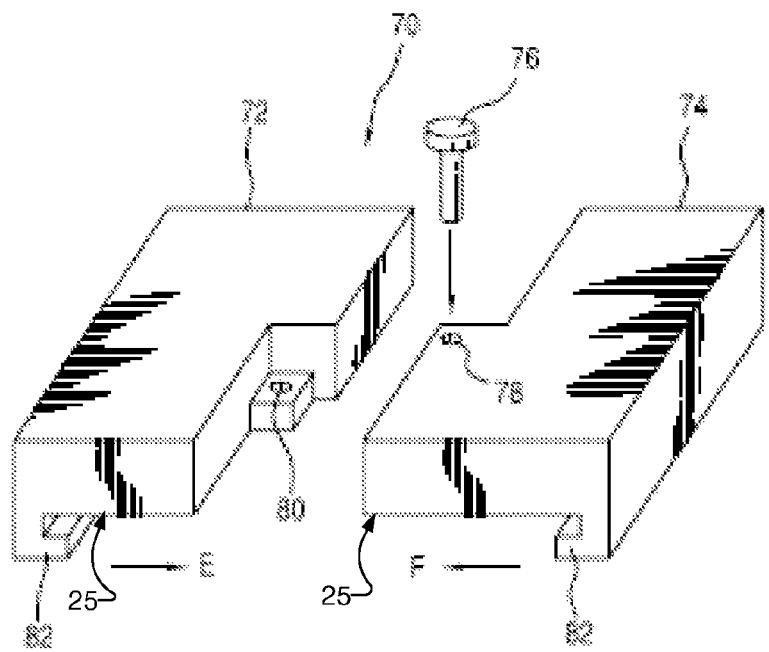
FIG. 7 is an exploded perspective view of a two piece stiffening brace.

FIG. 7 shows an embodiment of a stiffening brace 70 that includes two pieces 72 and 74. These two pieces can be mated together and fastened by a fastener such as a threaded type fastener 76 projecting into holes 78 and 80 as shown. This two piece arrangement can be mounted on to an IC 12 by having the two pieces slid together in the directions shown by arrows E and F, then having the fastener 76 applied. The stiffener 70 can be removed by performing the steps. Finger tabs 82 in this embodiment are similar to tabs 62 in FIG. 6.

Figure 8:
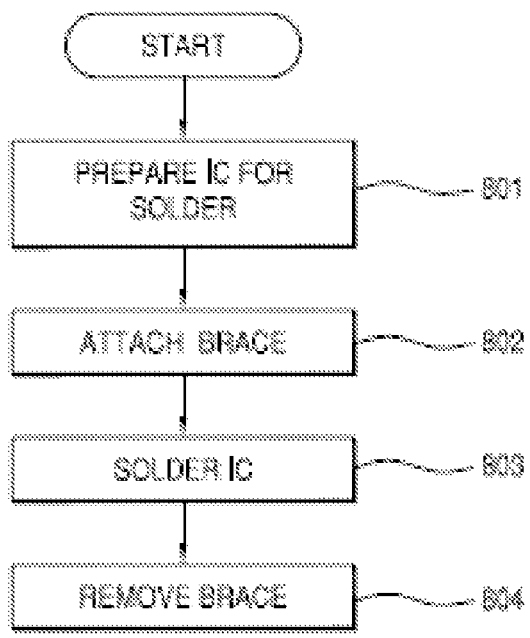
FIG. 8 is a process flow diagram of a method for soldering an IC package and utilizing a stiffening brace.

FIG. 8 is a process flow diagram depicting some steps that can be performed in an exemplary method using any of the stiffening braces described herein or other stiffening braces. Initially, at step 801, the IC is prepared for a solder operation. At step 802, a stiffening brace is attached to the IC. It is noted that some instances the stiffening brace may have been pre-installed on the IC and thus step 802 could occur before step 801. At step 803, the IC is soldered onto its mounting location. At step 804, the brace is removed. It is noted that removal of the brace in some instances may be optional and unnecessary.

The stiffening brace does not need to cover all of the IC, and besides the example shown in FIG. 5 having a relief cut outs, the flat portion can cover only one side or the corners or other selected regions of the IC. Further, the tabs do not need to project around any entire peripheral side of the IC but can be one or more individual finger type tabs discontinuously placed along a side of the IC. Also the tabs may extend over one side, two sides, three sides or all four sides of the IC. For any side where a tab is present, the tab does not need to extend along the entire side, but rather could take the form of one or more projecting portions that project down over only a portion of the IC.

In the illustrated embodiments, a main body portion, which is any one of stiffening brace 20, stiffener brace 30, stiffening brace 40, brace 50, stiffening brace 60, and stiffening brace 70, is clipped or otherwise mechanically fastened to an IC to reduce warpage of the IC, particularly during for example soldering. The main body may be removable or semi-permanently or permanently so fastened. The main body may be essentially a block having a bottom flat surface 25 being held against the top surface of the IC by clips clipped to the lower part of the IC and around a side of the IC. However, other main body shapes may occur such as a main body as a frame around the side perimeter of the IC and not covering the top of the IC at all.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A brace for use with an integrated circuit (IC), comprising:
   a main body portion having a flat surface held against a central area of a top surface of the IC, wherein the main body portion resists warping or bending of the IC; and
   a fastening portion for mechanically fastening the main body portion to the IC, wherein the fastening portion comprises a hinged arm having a tab that releasably engages the IC,
   wherein the brace exposes solder joints of the IC located on the bottom of the IC.

2. A brace according to claim 1, wherein the fastening portion removably engages the IC so that the brace is removable.

3. A brace according to claim 1, wherein the fastening portion comprises at least one resilient tab portion.

4. A brace according to claim 3, wherein the resilient tab portion has a ramp surface.

5. A brace according to claim 1, wherein the fastening portion comprises a tab portion having a squared off internal shoulder to trap a bottom corner of the IC.

6. A brace according to claim 1, wherein the main body has a plurality of beam members projecting upwardly from a top surface of the main body.

7. A brace for use with an integrated circuit (IC), comprising:
   a main body portion having a flat surface held against a central area of top surface of the IC, wherein the main body portion resists warping or bending of the IC; and
   a fastening portion for mechanically fastening the main body portion to the IC,
   wherein the brace is slidable onto the IC from an end of the IC,
   wherein the brace exposes solder joints of the IC located on the bottom of the IC.

8. A brace for use with an integrated circuit (IC), comprising:
   a main body portion having a flat surface held against a central area of a top surface of the IC, wherein the main body portion resists warping or bending of the IC; and
   a fastening portion for mechanically fastening the main body portion to the IC, wherein the main body has a plurality of relief areas therein,
   wherein the brace exposes solder joints of the IC located on the bottom of the IC.

9. A brace for use with an integrated circuit (IC), comprising:
   a main body portion having a flat surface held against a central area of a top surface of the IC, wherein the main body portion resists warping or bending of the IC; and
   a fastening portion for mechanically fastening the main body portion to the IC, wherein the flat surface of the main body portion comprises two pieces attachable to each other,
   wherein the brace exposes solder joints of the IC located on the bottom of the IC.

10. An IC package assembly comprising:
   an integrated circuit (IC) having a top surface, a bottom surface, and a plurality of solder joints on the bottom surface; and
   a brace attachable to the IC, the brace comprising:
      a main body portion having a flat surface held against a central portion of the top surface of the IC that resists warping or bending of the IC; and a fastening portion for mechanically fastening the main body portion to the IC, wherein the fastening portion comprises a hinged arm having a tab that releasably engages the IC.

11. An IC package assembly according to claim 10, wherein the fastening portion removably engages the IC so that the brace is removable.

12. An IC package assembly according to claim 10, wherein the fastening portion comprises at least one resilient tab portion.

13. An IC package assembly according to claim 12, wherein the resilient tab portion has a ramp surface.

14. An IC package assembly according to claim 10, wherein the fastening portion comprises a tab portion having a squared off internal shoulder to trap a bottom corner of the IC.

15. An IC package assembly according to claim 10, wherein the main body portion has a plurality of beam members projecting upwardly from a top surface of the main body portion.

16. An IC package assembly comprising:
an integrated circuit (IC) having a top surface, a bottom surface, and a plurality of solder joints on the bottom surface; and
a brace attachable to the IC, the brace comprising:
a main body portion having a flat surface held against a central portion of the top surface of the IC that resists warping or bending of the IC; and
a fastening portion for mechanically fastening the main body portion to the IC, wherein the brace is slidable onto the IC from an end of the IC.

17. An IC package assembly comprising:
an integrated circuit (IC) having a top surface, a bottom surface, and a plurality of solder joints on the bottom surface; and
a brace attachable to the IC, the brace comprising:
a main body portion having a flat surface held against a central portion of the top surface of the IC that resists warping or bending of the IC; and
a fastening portion for mechanically fastening the main body portion to the IC, wherein the main body has a plurality of relief areas therein.

18. An IC package assembly comprising:
an integrated circuit (IC) having a top surface, a bottom surface, and a plurality of solder joints on the bottom surface; and
a brace attachable to the IC, the brace comprising:
a main body portion having a flat surface held against a central portion of the top surface of the IC that resists warping or bending of the IC; and
a fastening portion for mechanically fastening the main body portion to the IC, wherein the flat surface of the main body portion comprises two pieces attachable to each other.

* * * * *